United States Patent
Eck

(10) Patent No.: US 11,881,848 B2
(45) Date of Patent: Jan. 23, 2024

(54) METHOD FOR CHECKING A SEMICONDUCTOR SWITCH FOR A FAULT

(71) Applicant: Webasto SE, Stockdorf (DE)

(72) Inventor: Philipp Eck, Stockdorf (DE)

(73) Assignee: WEBASTO SE, Stockdorf (DE)

( * ) Notice: Subject to any disclaimer, the term of this patent is extended or adjusted under 35 U.S.C. 154(b) by 137 days.

(21) Appl. No.: 17/435,583

(22) PCT Filed: Feb. 27, 2020

(86) PCT No.: PCT/EP2020/055142
§ 371 (c)(1),
(2) Date: Sep. 1, 2021

(87) PCT Pub. No.: WO2020/187543
PCT Pub. Date: Sep. 24, 2020

(65) Prior Publication Data
US 2022/0158633 A1    May 19, 2022

(30) Foreign Application Priority Data
Mar. 18, 2019   (DE) .................... 10 2019 106 787.1

(51) Int. Cl.
*G01R 31/26*     (2020.01)
*H03K 17/18*     (2006.01)
(Continued)

(52) U.S. Cl.
CPC ......... *H03K 17/18* (2013.01); *G01R 31/2617* (2013.01); *G01R 31/2621* (2013.01); *G01R 31/275* (2013.01); *H03K 17/082* (2013.01)

(58) Field of Classification Search
CPC ............ G01R 31/2617; G01R 31/2621; G01R 31/275; H03K 17/18; H03K 17/082; H03K 2217/0072
See application file for complete search history.

(56) References Cited

U.S. PATENT DOCUMENTS 8,027,132 B2 *   9/2011 Omaru ................. H02H 7/1225
                                                         361/93.1
2009/0174485 A1   7/2009 Teng et al.
(Continued)

FOREIGN PATENT DOCUMENTS

DE    102010042292 A    4/2012
DE    102014214156 A1   1/2016
(Continued)

OTHER PUBLICATIONS

Machine translation to English of Office Action for parallel application in Japan (JP 2021-555832) dated Sep. 26, 2022 (7 pages).
(Continued)

*Primary Examiner* — Thang X Le
(74) *Attorney, Agent, or Firm* — Fitch, Even, Tabin & Flannery, LLP

(57) ABSTRACT

The invention provides a method for checking a semiconductor switch for a fault, wherein the semiconductor switch is driven with a PWM signal with a variable duty cycle. To the benefit of determining faults on the semiconductor switch reliably and cost-effectively, it is provided that if the semiconductor switch is operated with a duty cycle of 100% or 0%, the current measurement of the overall system is evaluated, while if the semiconductor switch is operated with a duty cycle of between 0% and 100%, the generated voltage pulses across the semiconductor switch are evaluated.

6 Claims, 1 Drawing Sheet

Figure 1:
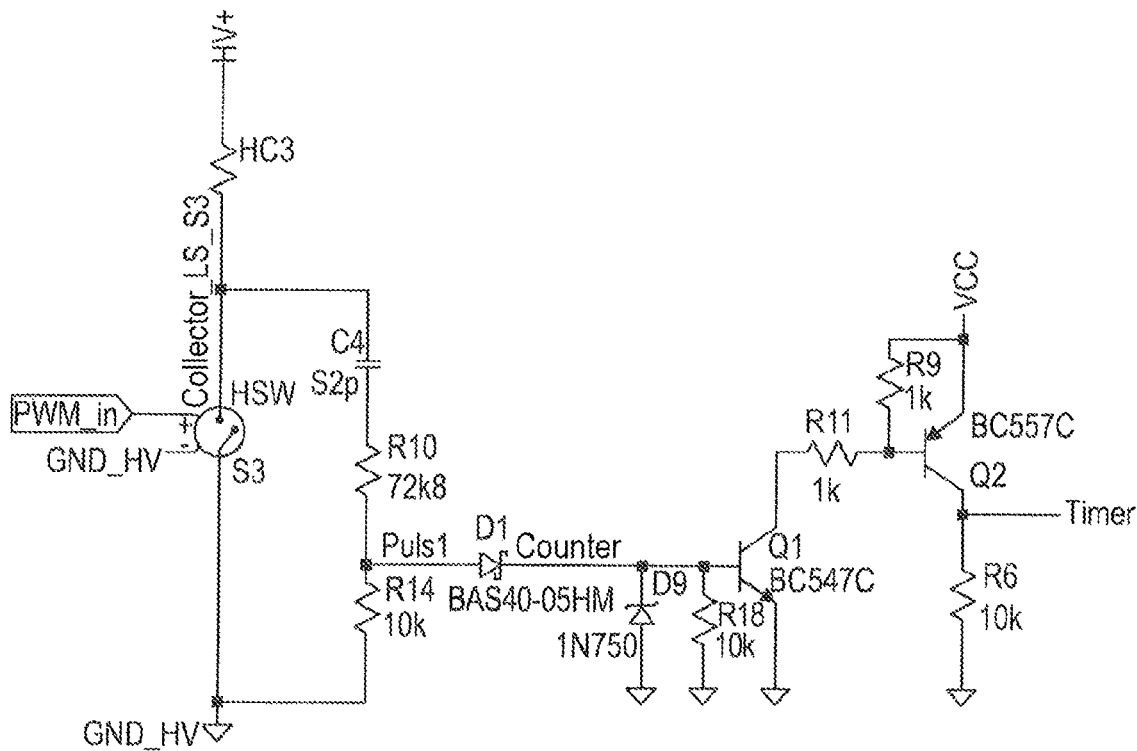

(51) Int. Cl.
    *G01R 31/27*   (2006.01)
    *H03K 17/082*  (2006.01)

(56) References Cited

U.S. PATENT DOCUMENTS

| | | | | |
|---|---|---|---|---|
| 2015/0303805 | A1* | 10/2015 | Franchini | H02M 3/158 |
| | | | | 324/503 |
| 2017/0012530 | A1* | 1/2017 | Pasqualetto | H02M 3/158 |
| 2018/0102773 | A1* | 4/2018 | Li | G01R 31/2837 |
| 2020/0041568 | A1* | 2/2020 | Oehler | G01R 31/50 |
| 2020/0355745 | A1* | 11/2020 | Bogus | H02H 7/0833 |

FOREIGN PATENT DOCUMENTS

| | | |
|---|---|---|
| DE | 102014226165 A1 | 6/2016 |
| JP | 2001268984 A | 9/2001 |
| JP | 2004306858 A | 11/2004 |
| JP | 2006220069 A | 8/2006 |
| JP | 2008164519 A | 7/2008 |
| JP | 2008199851 A | 8/2008 |
| JP | 2009159671 A | 7/2009 |
| JP | 2015119560 A | 6/2015 |
| KR | 1020180067129 | 6/2018 |

OTHER PUBLICATIONS

Office Action Issued against corresponding KR Patent Application No. 10-2021-7033246 dated Feb. 16, 2023 in Korean with English translation ( 9 pages).

International Search Report for PCT/EP2020/055142 dated May 13, 2020 in English and German (4 pages).

Office Action issued against corresponding DE Patent Application No. 10 2019 106 787.1 dated Feb. 4, 2020 in German with English machine translation (12 pages).

Office Action Issued against corresponding KR Patent Application No. 10-2021-7033246; dated Aug. 1, 2023 in Korean with English translation (6 Pages).

Office Action Issued against corresponding JP Patent Application No. 2021-555832; dated Jun. 1, 2023 in Japanese with English translation (8 Pages).

* cited by examiner

METHOD FOR CHECKING A SEMICONDUCTOR SWITCH FOR A FAULT

CROSS-REFERENCE TO RELATED APPLICATION

This application is a U.S. national phase application filed under 35 U.S.C. § 371 of International Application No. PCT/EP2020/055142, filed Feb. 27, 2020, designating the United States, which claims priority from German Patent Application Number DE 10 2019 106 787.1, filed Mar. 18, 2019, which is hereby incorporated herein by reference in its entirety for all purposes.

FIELD

The invention relates to a method for checking a semiconductor switch for a fault, in which the semiconductor switch is driven with a variable duty-cycle PWM signal.

BACKGROUND

To test a semiconductor switch (such as an IGBT, a MOSFET, or a bipolar transistor) for a fault, such as a short circuit or an open circuit, current or voltage measurements are made on the semiconductor switch or on the overall system into which the switch is integrated. In the case of current measurement a phase current of the semiconductor switch or the total current of the entire system is monitored. In voltage measurement the voltage drop across the semiconductor switch is monitored.

It is often necessary to drive the semiconductor switch with a variable duty-cycle PWM signal to ensure load/power regulation over various environmental variables, such as the supply voltage. Diagnosis of the semiconductor switch for a fault using a PWM signal with a variable duty cycle reaches its limits under the following two scenarios:
  If the duty cycle is set very high, for example 98%, no significant difference is obtained in the current through and the voltage across the semiconductor switch to that of a permanent short circuit.
  The same applies to very low duty cycles, for example 2%. In this reverse case, there is no significant difference to that of a permanent open circuit.

Furthermore, pure current measurement results in a strong dependence on environmental variables, such as the supply voltage.

SUMMARY

DE10 2014 214 156 A1 discloses a method for checking the functionality of a first semiconductor switch of a disconnection path of an electrical load circuit for supplying at least one valve coil (L) of a braking system. The first semiconductor switch is operated in a conductive state during operation and the load circuit current is regulated by at least one second, pulse-width-modulated semiconductor switch. The first semiconductor switch is driven during the operation of the vehicle braking system in such a way that it switches to a blocking state when it is functional and, after a specified period of the blocking state, the first semiconductor switch is driven in such a way that it switches back to a conducting state.

DE10 2010 042 292A discloses a method for functional testing of an electrical semiconductor switch, the control terminal of which is supplied with an ignition pulse by a control unit at an ignition time, wherein a current flow time at which the current amplitude flowing through the semiconductor switch departs from a value of zero is detected, and a time difference between the ignition time and the current flow time is evaluated to perform the functional test of the semiconductor switch.

One object of the invention is to create a method of the type mentioned above, with which the presence of a fault on a semiconductor switch can be determined reliably and cost-effectively.

This object is achieved by the features of claim 1. Advantageous extensions of the invention are specified in the dependent claims.

The invention therefore provides a method for checking a semiconductor switch for a fault, in which the semiconductor switch is driven with a PWM signal with variable duty cycle, wherein when the semiconductor switch is operated with a duty cycle of 100% or 0% the current measurement of the overall system is evaluated, while when the semiconductor switch is operated with a duty cycle between 0% and 100% the voltage pulses generated across the semiconductor switch are evaluated.

The invention is therefore limited to the fundamentally reliable diagnosis of the semiconductor switch when operated in PWM mode. If the switch is permanently active or inactive (duty cycle of 100% or 0%), the current measurement of the entire system is evaluated.

The method according to the invention is independent of most environmental conditions such as the supply voltage or the load, as it evaluates only the alternating voltage levels on the semiconductor.

Faults such as a high-resistance short circuit can also be detected. Such faults would not be detectable by a pure voltage and current measurement.

The method according to the invention is independent of most ambient conditions such as the supply voltage or the load, as it evaluates only the alternating voltage levels on the semiconductor switch. Faults such as a high-resistance short circuit can also be detected using the method according to the invention, hence faults that cannot be detected by pure voltage and current measurement.

In the interests of a simple but reliable determination of semiconductor functional faults the voltage pulses generated across the semiconductor switch are counted for the evaluation, wherein as a result of the evaluation a short circuit or an open circuit of the semiconductor switch is detected if the latter does not generate any voltage pulses.

In order to ensure a reliable and meaningful fault determination at a duty cycle of 100% or 0%, the evaluation of the voltage pulses generated across the semiconductor switch is aborted and the presence of a fault is determined by measuring the current of the entire system.

The invention also provides a device for carrying out the method according to the invention, wherein the voltage pulses generated across the semiconductor switch are tapped off it via a capacitor and applied to an A/D converter, which applies a digital signal to the counter input of a controller for the evaluation. The capacitor generates only momentary current and voltage pulses in the diagnostic circuit. The circuit on which the device is based can therefore be implemented with a small number of low-cost components.

A plurality of semiconductor switches can be connected to an A/D converter consisting of two transistors via a diode interconnection (OR-connection) using the above-mentioned diagnostic method. If the PWM activation of the semiconductors to be diagnosed is phase-shifted, all semiconductors can therefore be monitored via an A/D converter and a timer input on the controller.

BRIEF DESCRIPTIONS OF THE DRAWINGS

Figure 2:
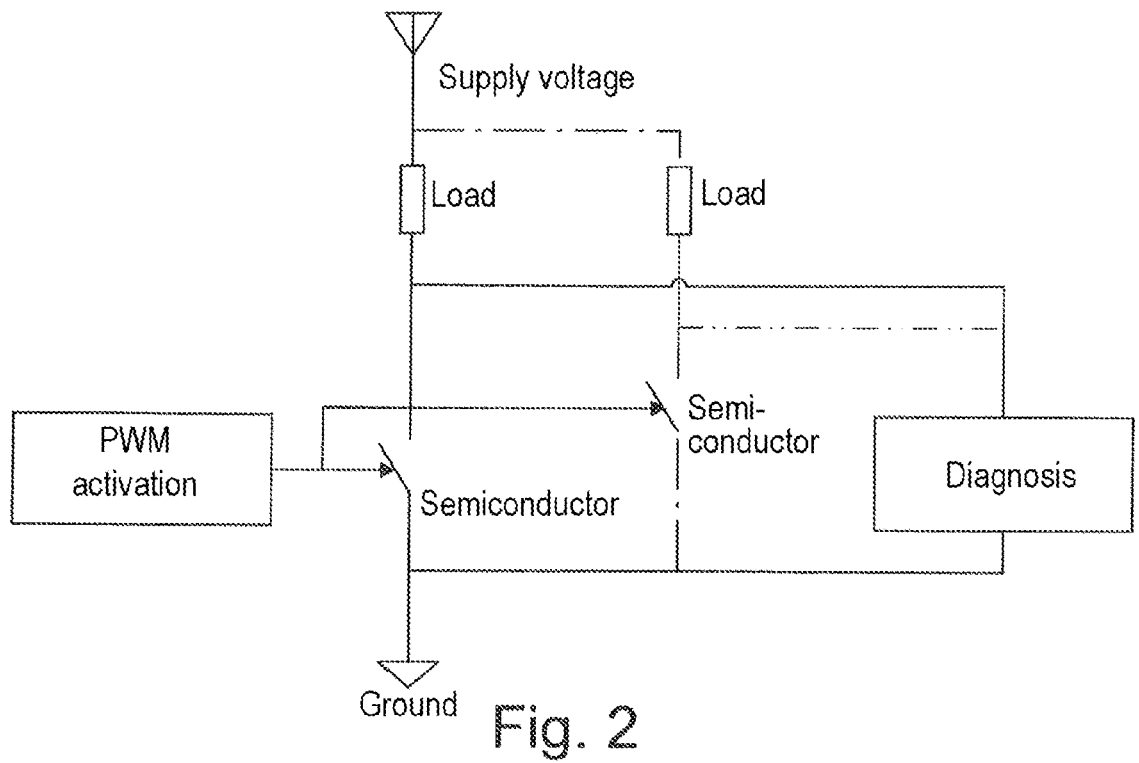

In the following the invention is explained in more detail on the basis of the drawings, in which:

FIG. 1 shows the circuit diagram of a first embodiment of the device according to the invention for carrying out the method according to the invention for checking a semiconductor switch for a fault, and FIG. 2 shows a schematic drawing of a modification of the device of FIG. 1 for checking a circuit with two semiconductor switches for a fault.

DETAILED DESCRIPTION

The device shown in FIG. 1 is based on a circuit for checking a semiconductor switch for a fault, in which the semiconductor switch is driven with a variable duty-cycle PWM signal. The collector of the semiconductor switch S3 is connected to a positive voltage HV+ via a load resistor HC3 and the other side of the switch is connected to a ground GND_HV. A PWM signal is applied at the input of the semiconductor switch.

A capacitor C4 filters out the voltage pulses from the collector of the semiconductor switch, which are produced in the PWM-switching case, since only these are required for the diagnosis of the switch. This circuit configuration provides the additional advantage that the rest of the circuit is not permanently connected to the supply potential, but is only loaded by individual pulses. This can significantly reduce the component count, as no continuous losses are generated.

The capacitor is connected to ground GND_HV via a voltage divider comprising a resistor R10 and a resistor R14. This voltage divider divides the generated voltage pulses down to lower values and reduces the pulse current through C4.

The pulses transmitted by the capacitor C4 are forwarded via a diode D1 to a subsequent signal conditioning stage as positive pulses. At this point, other diagnostic branches, not shown, can be linked at their cathodes (provided they have a phase offset) to form a disjunction (OR logic gate).

A Zener diode D9 connected after the OR gate protects the subsequent signal conditioning means against overvoltage. The said means comprises two transistors Q1 and Q2, which are connected to a simple A/D converter via resistors R18, R11 and R6 and R9 respectively, and generates a digital signal "Timer" from the positive pulse at the cathode of diode D9, which is fed to the counter input of a controller, not shown. On the controller, the diagnosis of the semiconductor switch is performed at the software level, wherein the incoming "Timer" pulses are counted. In the event of a fault on the semiconductor switch, no pulses are generated either in the case of a short circuit or an open circuit. This enables the software to detect the fault and to initiate appropriate measures.

At a duty cycle of 0% and 100%, this diagnosis at the software level is preferably switched off and a fault diagnosis is performed via the total current of the circuit.

The capacitor C4 generates only momentary current and voltage pulses in the diagnostic circuit. This allows the circuit to be implemented with a small number of low-cost components.

The functional principle of the circuit of FIG. 1 is shown in FIG. 2 for the case of simultaneous testing of two semiconductor switches for faults.

The invention claimed is:

1. A method for checking a semiconductor switch for a fault, the method comprising:
    driving the semiconductor switch with a PWM signal with variable duty cycle,
    wherein when the semiconductor switch is operating with a duty cycle of 100% or 0%, evaluating the current measurement of an overall system into which the semiconductor switch is integrated,
    wherein while when the semiconductor switch is operating with a duty cycle between 0% and 100%, evaluating the voltage pulses generated across the semiconductor switch;
    wherein the voltage pulses generated across the semiconductor switch are counted for the evaluation, and as a result of the evaluation a short circuit or an open circuit of the semiconductor switch is detected if the latter does not generate voltage pulses.

2. The method as claimed in claim 1, wherein at a duty cycle of 100% or 0% the evaluation is aborted and a fault is determined via the current measurement of the overall system.

3. A device for carrying out a method for checking a semiconductor switch for a fault, the method comprising:
    driving the semiconductor switch with a PWM signal with variable duty cycle,
    wherein when the semiconductor switch is operating with a duty cycle of 100% or 0%, evaluating the current measurement of an overall system into which the semiconductor switch is integrated,
    wherein while when the semiconductor switch is operating with a duty cycle between 0% and 100%, evaluating the voltage pulses generated across the semiconductor switch; and
    wherein the voltage pulses generated across the semiconductor switch (S3) are tapped off it via a capacitor (C4) and applied to an A/D converter (Q1, Q2), which applies a digital signal (Timer) to the counter input of a controller for the evaluation.

4. The device as claimed in claim 3, wherein the voltage pulses tapped off by the capacitor are converted by a diode (D4) into positive pulses that are applied to the A/D converter (Q1, Q2).

5. The device as claimed in claim 3, wherein the voltage pulses generated across the semiconductor switch are counted for the evaluation, and as a result of the evaluation a short circuit or an open circuit of the semiconductor switch is detected if the latter does not generate voltage pulses.

6. The device as claimed in claim 3, wherein the voltage pulses generated across the semiconductor switch are counted for the evaluation, and as a result of the evaluation a short circuit or an open circuit of the semiconductor switch is detected if the latter does not generate voltage pulses, and
    wherein at a duty cycle of 100% or 0% the evaluation is aborted and a fault is determined via the current measurement of the overall system.

* * * * *